(12) United States Patent
Yonekawa et al.

(10) Patent No.: US 7,482,882 B2
(45) Date of Patent: Jan. 27, 2009

(54) VOLTAGE CONTROL OSCILLATION CIRCUIT AND ADJUSTING METHOD FOR THE SAME

(75) Inventors: Masayuki Yonekawa, Kasugai (JP); Yasuhiro Korogouchi, Kasugai (JP); Mayo Kitano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/143,643

(22) Filed: Jun. 3, 2005

(65) Prior Publication Data
US 2006/0158266 A1 Jul. 20, 2006

(30) Foreign Application Priority Data
Jan. 20, 2005 (JP) .............................. 2005-013094

(51) Int. Cl.
*H03L 7/093* (2006.01)
(52) U.S. Cl. .............................. 331/17; 331/10; 331/16; 327/157
(58) Field of Classification Search .................. 331/10, 331/16, 17; 327/157; 375/376
See application file for complete search history.

(56) References Cited
U.S. PATENT DOCUMENTS
5,828,266 A * 10/1998 Couet .......................... 329/325

6,137,375 A * 10/2000 Li ............................... 331/175
7,038,552 B2 * 5/2006 Brett et al. .................... 331/183

FOREIGN PATENT DOCUMENTS
| JP | 10-247820 A | 9/1998 |
| JP | 10-256904 A | 9/1998 |
| JP | 2000-332606 A | 11/2000 |
| JP | 2003-078348 A | 3/2003 |

* cited by examiner

*Primary Examiner*—Robert Pascal
*Assistant Examiner*—James E Goodley
(74) *Attorney, Agent, or Firm*—Arent Fox LLP.

(57) ABSTRACT

A voltage control oscillation (VCO) circuit and an adjusting method for the same, which enables an adjustment for suppressing the dispersion of the output characteristic in spite of the manufacture-related dispersion of element characteristics, using a simple circuit configuration, are provided. A low-pass filter 15 and a high-pass filter 16 are composed of the elements that have the same structure as elements composing the VCO circuit 11, and a prescribed correlation is established between both elements. A corrective element 14 is connected in parallel to a main element, in which an oscillation frequency control signal VT is input, in the VCO circuit 11. Respective frequency-gain characteristic lines of the low-pass/high-pass filters 15 and 16 have gradients reverse to each other and cross at a target gain TG. When the capacitance value lowers in dispersion, the level of an output signal SL2 becomes higher than that of an output signal SH2 at a reference frequency fREF to form an output level difference LD2. In response, an adjusting signal VCNT2 is output in correspondence to the output level difference LD2 to lower an oscillation frequency fVCO.

11 Claims, 11 Drawing Sheets

A PRINCIPLE DIAGRAM FOR EXPLAINING A VCO CIRCUIT OF THE INVENTION

A CIRCUIT BLOCK DIAGRAM (1) FOR DEPICTING THE VCO CIRCUIT

A SPECIFIC EXAMPLE OF THE LOW-PASS FILTER (LPF) 15

A SPECIFIC EXAMPLE OF THE HIGH-PASS FILTER (HPF) 16

A SPECIFIC EXAMPLE OF THE DC CONVERSION CIRCUITS 17 AND 18

FIG. 6
A PERFORMANCE WAVEFORM CHART OF THE DC CONVERSION CIRCUITS 17 AND 18
(A) OUTPUT SIGNAL SL, SH
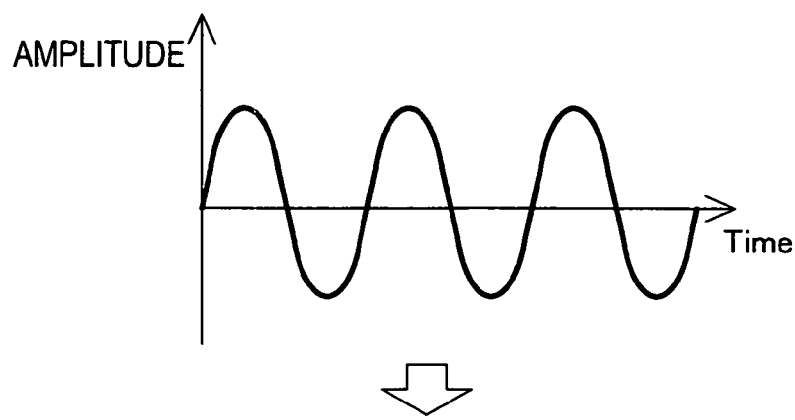
(B) OUTPUT SIGNAL RSL, RSH
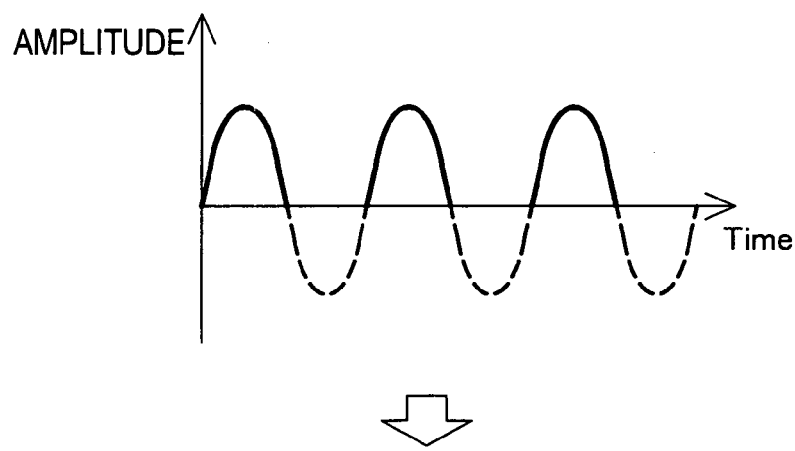
(C) SMOOTHED DC VOLTAGE SIGNAL VL, VH
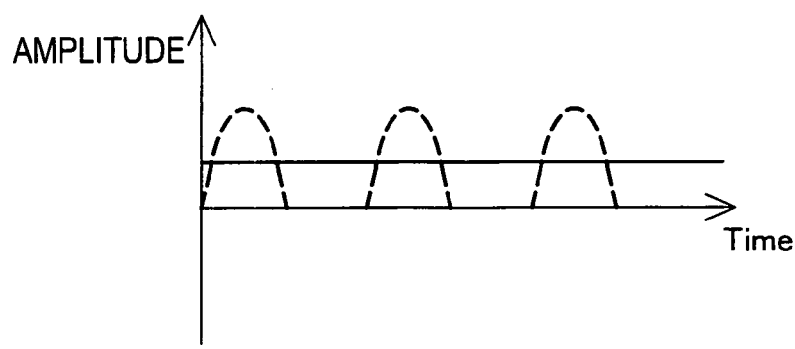

A SPECIFIC EXAMPLE OF THE COMPARATOR CIRCUIT 19, THE CORRECTIVE ELEMENT 14, AND THE VCO CIRCUIT 11

FIG. 8 A CHART FOR EXPLAINING THE PERFORMANCE OF THE VCO CIRCUIT 11

A CHART FOR DEPICTING THE CAPACITANCE CHARACTERISTIC OF THE VARIABLE CAPACITANCE ELEMENT RELATIVE TO THE ADJUSTING SIGNAL VCNT

A CHART FOR DEPICTING A CORRELATION BETWEEN THE ADJUSTING SIGNAL VCNT AND THE OSCILLATION FREQUENCY fVCO

A CIRCUIT BLOCK DIAGRAM (2) FOR DEPICTING THE VCO CIRCUIT

A CIRCUIT DIAGRAM OF A CONVENTIONAL VCO CIRCUIT

A BLOCK DIAGRAM OF A CONVENTIONAL FREQUENCY SYNTHESIZER

A CHART FOR DEPICTING A CORRELATION BETWEEN THE CHARACTERISTIC VALUE OF THE ELEMENT AND THE OSCILLATION FREQUENCY OF THE VCO CIRCUIT

VOLTAGE CONTROL OSCILLATION CIRCUIT AND ADJUSTING METHOD FOR THE SAME

CROSS-REFERENCE TO RELATED APPLICATIONS

This application is based upon and claims the benefit of priority from each of the prior Japanese Patent Application No. 2005-013094 filed on Jan. 20, 2005, the entire contents of which are incorporated herein by reference.

BACKGROUND OF THE INVENTION

1. Field of the Invention

This invention relates to a voltage control oscillation circuit and an adjusting method for the same, in particular, to a voltage control oscillation circuit and an adjusting method for the same, which enables an adjustment for suppressing the dispersion of output characteristics of the oscillation circuit, in spite of the manufacture-related dispersion of the characteristics of circuit elements, when the circuit is incorporated into an IC.

2. Description of Related Art

A demand for fewer components in various electronic devices, typically in mobile radio communication devices including cellular phones, has been increasing in recent years. For example, an oscillation circuit built in an IC in a mobile radio communication device is expected to reduce the number of components used in the device. As an instance of such an oscillation circuit, a voltage control oscillation circuit (hereinafter referred to as VCO circuit) is shown in FIG. 12. The VCO circuit in FIG. 12 includes a resonance circuit consisting of an inductor section 101 and a capacitance section 102. The oscillation frequency f of the resonance circuit is given by the following equation (10):

$$f = 1/(2\pi \times (L \times C)^{1/2})$$

where L is the inductance of the inductor section 101 and C is the capacity of the capacitance section 102.

The capacity of variable-capacitance diodes in the capacitance sections 102 is changed by an incoming control voltage VT, which means the control voltage VT adjusts the oscillation frequency f. The VCO circuit arranged like this constitutes a phase lock loop (hereinafter referred to as PLL). The oscillation frequency f of the VCO circuit is conformed to a preset frequency of the PLL for a practical application.

A method for correcting the dispersion of circuit elements and adjusting a variable range of the oscillation frequency of output from a VCO circuit in a frequency synthesizer is disclosed in Japanese Unexamined Patent Publication No. 2000-332606. As shown in FIG. 13, an output signal from a VCO (voltage control oscillator) 110 is divided and divided signals are subjected to phase comparison with a reference signal from a reference oscillator 162 at a phase comparator 163. Compared signals are sent to a LPF (low-pass filter) 150, where the signals are converted into DC voltage signals, which are then applied to a variable resonance circuit, which includes variable-capacitance diodes, in the VCO 110. Meanwhile, an adjusting circuit 170 compares an inner reference voltage with an output control voltage from the LPF 150, and adjusts the resonance circuit in the VCO 110 so that an output frequency of the VCO 110 becomes within a desired variable range.

A technique related to the above method is also disclosed in Japanese Unexamined Patent Publication No. H10(1998)-256904.

SUMMARY OF THE INVENTION

When such a VCO circuit as described above is incorporated in an IC circuit, however, the characteristics of elements built in the IC become inevitably dispersed due to manufacturing processes of the IC, which makes the characteristic of the VCO circuit also a dispersed one. FIG. 14 shows a graph presented to explain such a phenomenon. A line (A) in the graph indicates the change of the capacitance value C of the variable-capacitances diodes, which compose the capacitance section 102, in response to the control voltage VT, while a line (B) in the graph indicates the change of the oscillation frequency f in response to the control voltage VT, which is given on the basis of the oscillation characteristic of the VCO circuit relative to the capacitance value C.

When the VCO circuit having the characteristic as shown in FIG. 14 is used in a PLL, the control voltage VT is changed to lock the frequency of an output signal to a preset frequency when the capacitance value C of the capacitance section 102 shows manufacture-related dispersion. The manufacture-related dispersion of the oscillation characteristic, therefore, appears as the dispersion of the control voltage VT in locking the output frequency in the PLL.

If the dispersion of capacitance value C of the capacitance section 102 increases further, the oscillation frequency band of the VCO circuit may be out of the lock range of the PLL completely. This means a failure in frequency lock in the PLL, thus no output signal locked to the preset frequency is provided. Additionally, even if the oscillation frequency band is within the lock range, the loop characteristic of the PLL becomes abnormal when the control voltage VT is extremely higher or lower than a normal value. The abnormal loop characteristic results in the deterioration of a phase noise characteristic or a longer lock up time that is taken to lock an output signal to the preset frequency.

To solve the above problem, according to the method disclosed in Japanese Unexamined Patent Publication No. 2000-332606, the adjusting circuit 170 compares the inner reference voltage with the output control voltage from the LPF 150, and adjusts the resonance circuit in the VCO 110 so that an output frequency of the VCO 110 becomes within a desired variable range.

This case, however, requires a PLL circuit having the VCO circuit to adjust the oscillation characteristic of the VCO circuit. The PLL circuit must include the reference oscillator 162, the phase comparator 163, and the LPF 150, in addition to the VCO circuit to be adjusted. As a result, the PLL circuit comes to have a large-scale, complicated configuration, which is a problem.

In order to incorporate any electronic component into a portable device or the like, saving space is a prerequisite, which makes it necessary for a component with a specific function to be made into one chip. Accordingly, when a VCO circuit is made into one chip, it is essential that the oscillation characteristic of the VCO circuit can be adjusted inside the chip without a separate corrective control signal, that is, the oscillation characteristic can be adjusted by the chip itself consisting of the VCO circuit. Contrary to that, a configuration including separate circuits for oscillation characteristic adjustment in addition to a VCO circuit results in a large-scale, complicated circuit, which is not desirable.

In order to solve at least one of the problems mentioned in the background of the invention, the purpose of this invention is to provide a voltage control oscillation circuit and an adjusting method for the same, which enables an adjustment for suppressing the dispersion of output characteristics of the oscillation circuit, in spite of the manufacture-related dispersion of the characteristics of circuit elements, through a simple circuit configuration.

To achieve the above object, according to one aspect of the invention, there is provided a voltage control oscillation circuit which comprises a low-pass filter and/or a high-pass filter, each of which is preset to have a gain identical to a preset target gain at a reference frequency in an attenuating band according to a frequency-gain characteristic in response to an input signal having the reference frequency and is provided with an element having a prescribed correlation with an element that specifies an oscillation frequency; wherein an oscillation frequency of the voltage control oscillation circuit is adjusted in correspondence to a differential between the gain of the low-pass filter and that of the high-pass filter, or to a differential between either of respective gains of the low-pass/high-pass filters and the target gain at the reference frequency.

Further, according to another aspect of the invention, there is provided an adjusting method for the voltage control oscillation circuit, wherein respective gains of the low-pass filter and/or the high-pass filter, the filters having the prescribed correlation with the element that specifies the oscillation frequency, at the reference frequency in the attenuating band according to the frequency-gain characteristic are set to coincide with the preset target gain, and the oscillation frequency of the voltage control oscillation circuit is adjusted in correspondence to the differential between the gain of the low-pass filter and that of the high-pass filter, or to the differential between either of respective gains of the low-pass/high-pass filters and the target gain at the reference frequency.

The VCO circuit according to the invention has a low-pass filter and/or a high-pass filter, and a reference frequency signal is input in both filters. Each filter is set to have a gain coinciding with a preset target gain in response to a reference frequency in an attenuation band according to the frequency-gain characteristic of the filter.

In the VCO circuit, elements for specifying an oscillation frequency and elements in the low-pass filter and/or the high-pass filter have a prescribed correlation.

The prescribed correlation means such a relation that both elements have the same element structure and element characteristic, and/or the same circuit structure and circuit characteristic, and representative element parameters, such as capacitance values, that are defined by an identical function and have the same dependency. The oscillation frequency of the VCO circuit is adjusted in correspondence to a differential between a gain of the low-pass filter and that of the high-pass filter, or a differential between a gain of either filter and the target gain at the reference frequency.

By detecting the differential between the output gain in response to an incoming reference frequency signal and the target gain at the reference frequency in the attenuation band according to the frequency-gain characteristic, the extent of a shift of the oscillation frequency characteristic of the VCO circuit from a prescribed characteristic can be recognized. This oscillation frequency characteristic shift is caused by the fluctuation of capacitance values or the like due to manufacture-related dispersion. Accordingly, the oscillation frequency of the VCO circuit is adjusted in correspondence to the gain differential. This enables a self-adjustment of the oscillation characteristic by the VCO circuit itself, which has the low-pass filter and/or the high-pass filter. Also, the adjustment corresponding to the gain differential allows the oscillation frequency characteristic to be kept conformed to the prescribed characteristic without constructing a large-scale feedback loop, such as a PLL circuit. This eliminates a need for an oscillation characteristic adjustment for the VCO circuit in the configuration that includes extra circuits in addition to the VCO circuit, thus eliminating a concern for a larger and more complicated circuit configuration. Further, the oscillation frequency adjustment based on the gain differential allows an automatic adjustment of the oscillation characteristic of the VCO circuit as one chip, which contributes to the reduction of component spaces when the VCO circuit is incorporated into a portable device or the like.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 6 is a performance wave form chart of the DC conversion circuits 17 and 18;

DETAILED DESCRIPTION OF THE PREFERRED EMBODIMENTS

The following is a detailed description of embodiments of the VCO circuit and the adjusting method for the same according to the invention, and the description is given referring to FIG. 1 to FIG. 10.

Figure 1:
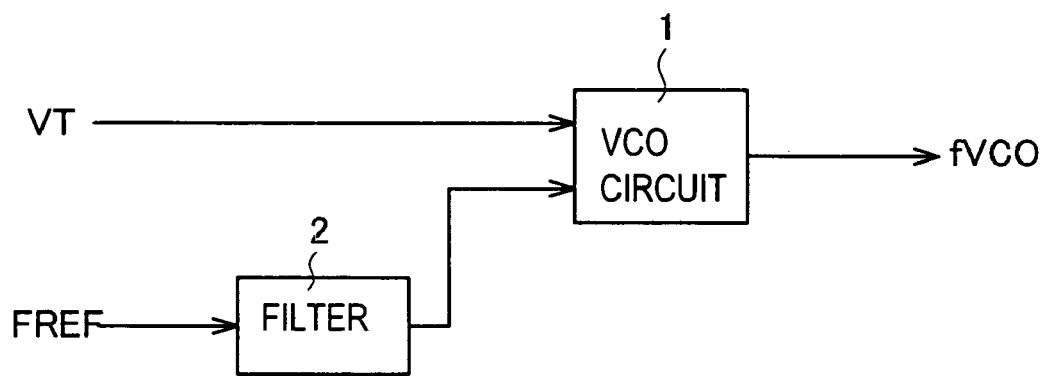
FIG. 1 is a principle diagram for explaining the VCO circuit according to the invention.

FIG. 1 is the principle diagram for explaining a VCO circuit according to the invention. The VCO circuit 1 outputs a signal at an oscillation frequency fVCO in response to an input oscillation frequency control signal VT, and is provided with a filter 2 for adjusting the oscillation frequency characteristic of the VCO circuit 1. The filter 2 has at least either of a low-pass filter (LPF) and a high-pass filter (HPF). A reference signal FREF having a reference frequency fREF is input in the filter 2. The reference signal FREF is a stable reference signal different from an actuating frequency signal for the VCO circuit 1. The output terminal of the filter 2 is connected to the VCO circuit 1. According to this arrangement, the parameter values of the elements that specify the oscillation frequency of the VCO circuit 1 are adjusted variably in correspondence to an output signal from the filter 2 in order to adjust the oscillation frequency characteristic of the VCO circuit 1.

The low-pass and high-pass filters are preset so that an output gain of each filter coincides with a target gain in response to the reference frequency fREF in an attenuation band according to the frequency-gain characteristic of each filter when the filters show no element dispersion in an ideal state. In this case, a specific correlation is established between at least either of the low-pass/high-pass filters and the VCO circuit 1. According to the correlation, either of the filters and the VCO circuit 1 have the same element structure and element characteristic, and/or the same circuit structure and circuit characteristic, and representative element parameters, such as capacitance values, that are defined by an identical function and have the same dependency. When elements composing the filter 2 show no dispersion, no gain differential results between the gain given in response to the reference frequency fREF and the target gain when the reference signal FREF having the reference frequency fREF is input in the filters 2. This means that the VCO circuit 1, which has the prescribed correlation with either of the low-pass/high-pass filters, has a desired oscillation characteristic.

On the other hand, when the characteristic of the low-pass/high pass filters shifts from their preset characteristic due to manufacture-related dispersion, the gain of respective low-pass/high-pass filters given in response to the reference frequency fREF shifts from the target gain. If the reference signal FREF having the reference frequency fREF is input, an output signal shows a gain differential between the low-pass filter gain and the target gain and between a high-pass filter gain and the target gain. In this case, the oscillation frequency characteristic of the VCO circuit 1 is adjusted in correspondence to the gain differential in order to have the prescribed correlation. This adjustment puts the oscillation frequency characteristic of the VCO circuit 1 under a condition of no element dispersion.

By detecting a differential between an actual gain and the target gain in response to the input reference frequency in the attenuation band according to the filter frequency-gain characteristic, therefore, a shift of the oscillation frequency characteristic of the VCO circuit from a desired characteristic, which is caused by manufacture-related element dispersion or the like, is recognized. The oscillation frequency characteristic is adjusted in correspondence to the gain differential, which makes it possible to keep adjusting the oscillation frequency characteristic to the desired state by the VCO circuit itself without constructing a large-scale feedback loop, such as a PLL circuit. This eliminates a need for an oscillation characteristic adjustment for the VCO circuit in a configuration that includes extra circuits in addition to the VCO circuit, thus eliminating a concern for a larger and more complicated circuit configuration.

Figure 2:
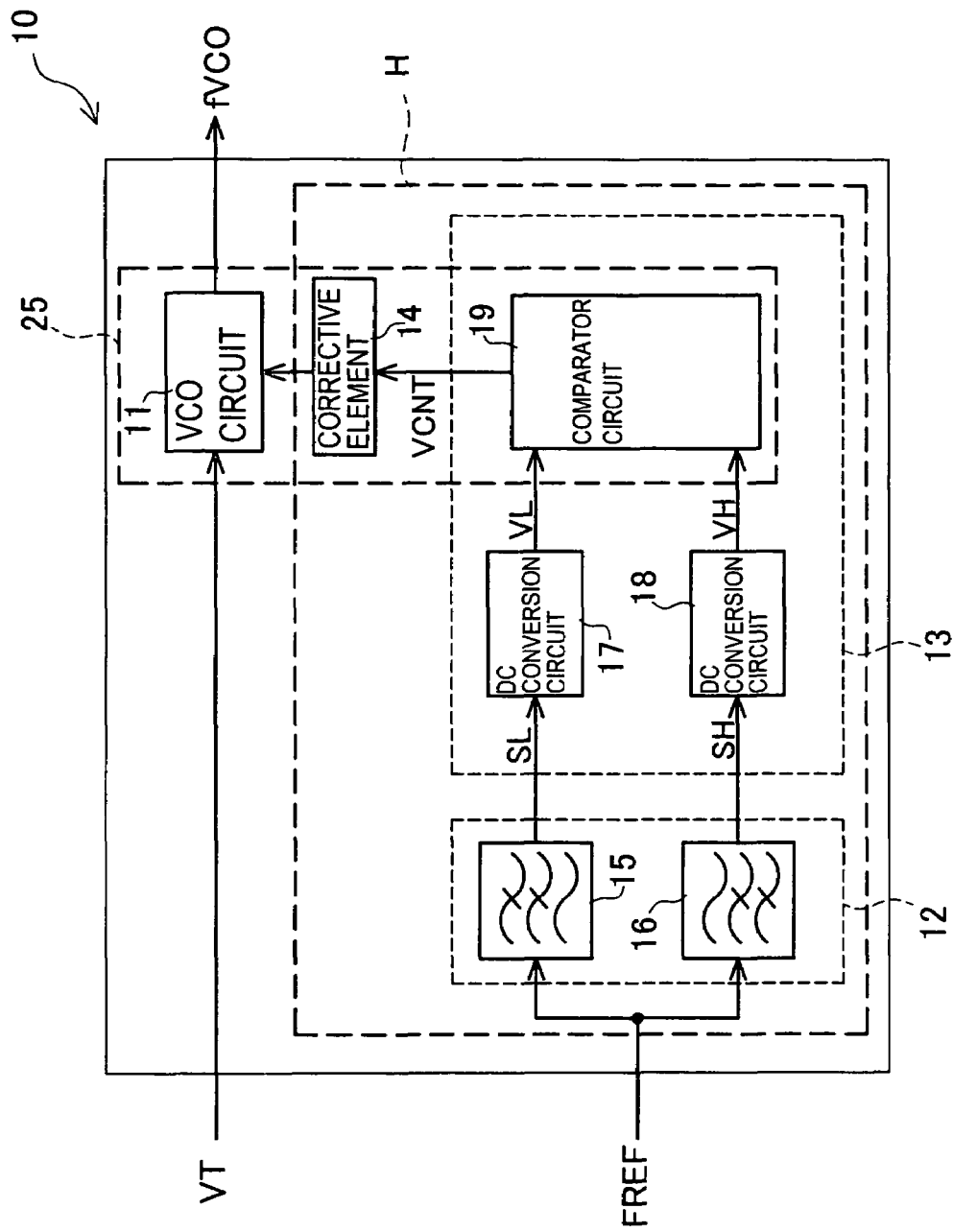
FIG. 2 is a circuit block diagram (1) for depicting the VCO circuit.

FIG. 2 is the circuit block diagram for depicting a VCO circuit according to an embodiment of the invention. FIG. 2 shows a semiconductor 10 having the VCO circuit 11, which outputs a cyclic signal having an oscillation frequency fVCO in response to an input oscillation frequency control signal VT. The semiconductor 10 is an instance for explaining this embodiment.

The semiconductor 10 includes the VCO circuit 11, a filter 12, a detecting circuit 13, and a corrective element 14. The filter 12, the detecting circuit 13, and the corrective element 14 jointly form a corrective circuit H.

The VCO circuit 11 outputs the signal having the oscillation frequency fVCO in response to the input oscillation frequency control signal VT. The oscillation frequency fVCO is given by the following equation (1):

$$fVCO = 1/(2\pi \times (L \times C)^{1/2})$$

where L is the inductance of an inductor section 20, and C is the combined capacity of a capacitance section 21 and the corrective element 14 (the inductance L and the combined capacity C will be explained later) The filter 12 consists of a low-pass filter (LPF) 15 and a high-pass filter (HPF) 16. The detecting circuit 13 has DC conversion circuits 17 and 18 and a comparator circuit 19. Respective output signals SL and SH from the low-pass filter 15 and the high-pass filter 16 are smoothed into DC voltage signals VL and VH via the DC conversion circuits 17 and 18, which are connected to the low-pass filter 15 and the high-pass filter 16, respectively. The DC voltage signals VL and VH are then input in the comparator circuit 19, in which the voltage levels of respective DC voltage are compared. After the voltage level comparison, the comparator circuit 19 outputs an adjusting signal VCNT, which is sent to the corrective element 14 that is a variable capacitance element. The corrective element 14 is connected in parallel to the main element of the VCO circuit 11, in which the oscillation frequency control signal VT is input.

Figure 3:
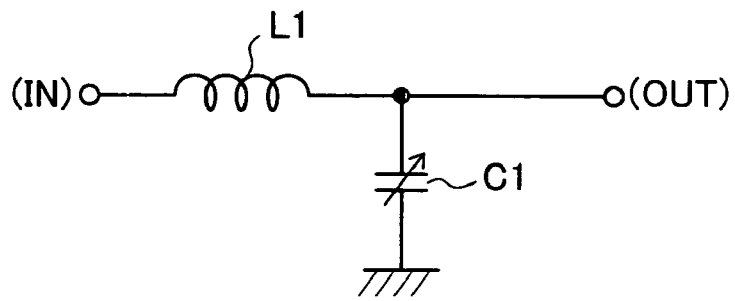
FIG. 3 is a specific example of the low-pass filter (LPF) 15.
Figure 4:
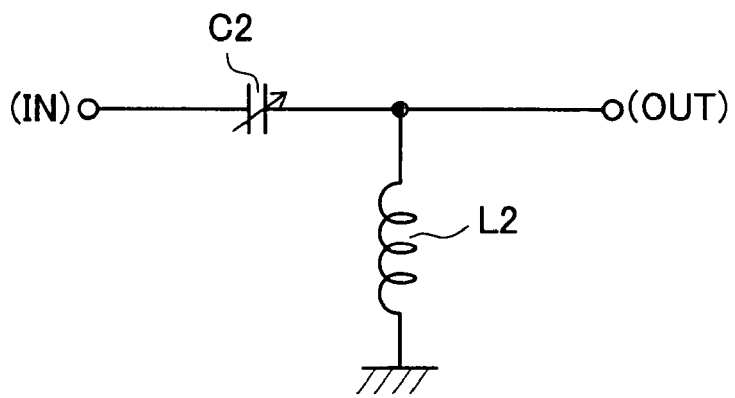
FIG. 4 is a specific example of the high-pas filter (HPF) 16.

FIG. 3 and 4 shows a specific example of the low-pass filter 15 and the high-pass filter 16, each of which has a variable capacitance element. Both filters 15 and 16 are composed of the elements that have the same structure as elements composing the VCO circuit 11. Those elements of identical structure establish a prescribed correlation, and the correlation is retained even if the element values of both elements are different as long as both elements have the same structure. The prescribed correlation means such a relation that both elements have the same element structure and element characteristic, and/or the same circuit structure and circuit characteristic, and representative element parameters, such as capacitance values, that are defined by an identical function and have the same dependency.

By recognizing the dispersion of respective elements composing the low-pass and high-pass filters 15 and 16, therefore, element dispersion in the VCO circuit 11 is recognized. In other words, a differential between an actual oscillation frequency of output from the VCO circuit 11 and a target oscillation frequency is recognized in relation to a differential between an actual gain and a target gain in response to a reference frequency.

FIG. 3 shows a specific example of the low-pass filter (LPF) 15. The low-pass filter 15 has a coil element L1 arranged between an input terminal (IN) and an output terminal (OUT), and a variable capacitance element C1 arranged between the output terminal (OUT) and a ground potential. The coil element L1 and the variable capacitance element C1 have the same structure as the elements composing the VCO circuit 1. When the capacitance value of the variable capacitance element C1 is C1, a cut-off frequency fCUTL, which is one of the filter characteristics of the low-pass filter (LPF) shown in FIG. 3, is defined by the following equation (2):

$$fCUTL = 1/(2\pi \times (L1 \times C)^{1/2})$$

The equation (2) is identical to the equation (1) that represents the oscillation frequency fVCO of the VCO circuit 11. The reference signal FREF having the reference frequency fREF is input in the input terminal (IN) and the output signal SL is output from the output terminal (OUT). At this time, the output signal SL becomes a signal that is damped according to a prescribed gradient when the frequency of the reference signal FREF exceeds the cut-off frequency fCUTL.

FIG. 4 shows a specific example of the high-pass filter (HPF) 16. The high-pass filter 16 has a variable capacitance element C2 arranged between an input terminal (IN) and an output terminal (OUT), and a coil element L2 arranged between the output terminal (OUT) and a ground potential. The coil element L2 and the variable capacitance element C2 have the same structure as the elements composing the VCO circuit 1. Also, the element value of the coil element L2 and of the variable capacitance element C2 is the same as that of the coil element L1 and of the variable capacitance element C1. When the inductance of the coil element L2 is L2 and the capacity of the variable capacitance element C2 is C2, a cut-off frequency fCUTH, which is one of the filter characteristics of the high-pass filter (HPF) shown in FIG. 4, is defined by the following equation (3):

$$fCUTH = 1/(2\pi \times (L2 \times C2)^{1/2})$$

The equation (3) is identical to the equation (1) that represents the oscillation frequency fVCO of the VCO circuit 11 and with the equation (2) that represents the cut-off frequency fCUTL. The reference signal FREF having the reference frequency fREF is input in the input terminal (IN) and the output signal SH is output from the output terminal (OUT). At this time, the output signal SH becomes a signal that is damped according to a prescribed gradient when the frequency of the reference signal FREF is lower than the cut-off frequency fCUTH.

Figure 5:
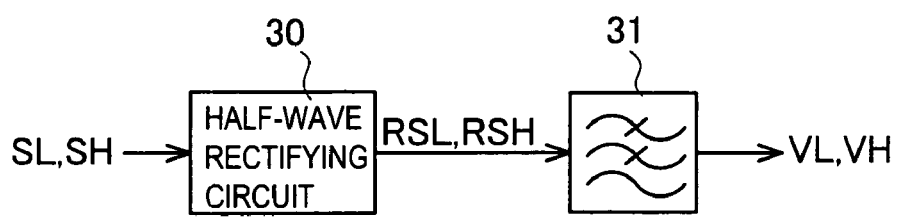
FIG. 5 is a specific example of the DC conversion circuits 17 and 18.

FIG. 5 shows a specific example of the DC conversion circuits 17 and 18, which smooth respective output signals SL and SH from the low-pass/high-pass filters 15 and 16, which are output as frequency signals, into DC voltage signals. Each DC conversion circuits 17 and 18 has a half-wave rectifying circuit 30 and a low-pass filter 31. The output signals SL and SH from the low-pass/high-pass filter 15 and 16 are input in the half-wave rectifying circuits 30 of the DC conversion circuits 17 and 18, respectively. Output signals RSL and RSH from the half-wave rectifying circuits 30 are then input in the low-pass filters 31, respectively, from which the DC voltage signals VL and VH are output to be sent to the comparator circuit 19.

FIG. 6 is the waveform chart of the DC conversion circuits 17 and 18 for explaining their performance. Respective output signals SL and SH, as shown in FIG. 6(A), are input in respective half-wave rectifying circuits 30, in which the output signals SL and SH are rectified into positive half-wave signals at gain 1. Then half-rectified output signals RSL and RSH are output from the half-wave rectifying circuits 30, as shown in FIG. 6(B), and are input in the low-pass filters 31, which filter out the AC components of the half-wave rectified voltage of the signals RSL and RSH and send their DC components to the comparator circuit 19, respectively. Accordingly, the smoothed DC voltage signals VL and VH, as shown in FIG. 6(C), are output from the half-wave rectifying circuits 30 and are sent to the comparator circuit 19.

Figure 7:
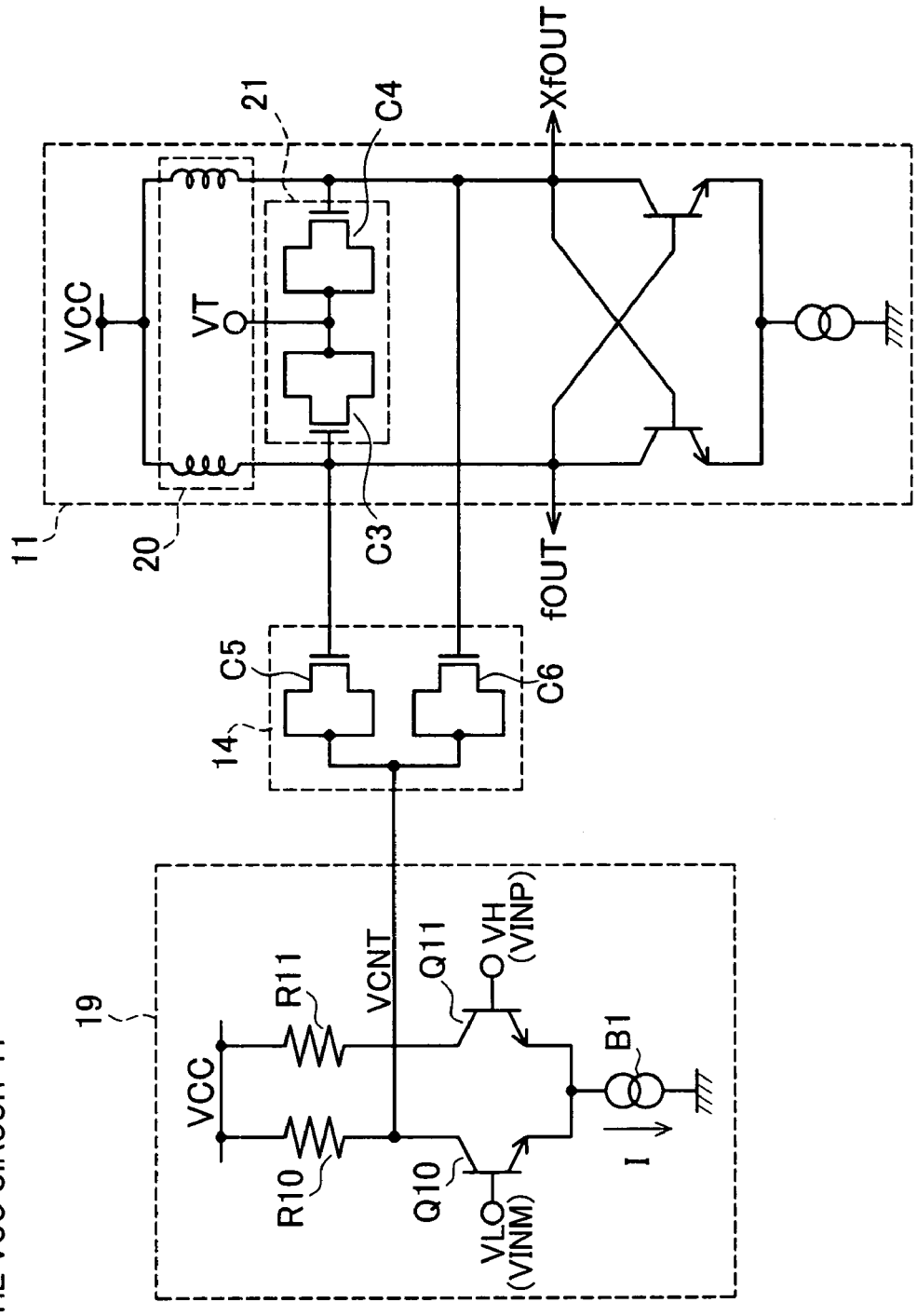
FIG. 7 is a specific example of the comparator circuit 19, the corrective element 14, and the VCO circuit 11.

FIG. 7 shows a specific example of the comparator circuit 19, the corrective element 14, and the VCO circuit 11, which are arranged in an area 25 in the semiconductor 10, as shown in FIG. 2. The comparator circuit 19 receives the smoothed DC voltage signals VL and VH from the DC conversion circuits 17 and 18, compares the voltage levels of respective signals VL and VH, and outputs the adjusting signal VCNT. The corrective element 14 is a variable capacitance element, whose capacitance value is adjusted variably in correspondence to the incoming adjusting signal VCNT. The VCO circuit 11 outputs an output signal fOUT having the oscillation frequency fVCO in correspondence to the incoming oscillation frequency control signal VT, and the oscillation frequency characteristic of the VCO circuit 11 is adjusted in accordance with the adjustment of the capacitance value of the corrective element 14.

The configuration of the comparator circuit 19 is shown in FIG. 7. The comparator circuit 19 has a difference input pair consisting of an inverting input terminal (VINM) and a non-inverting input terminal (VINP), in which the DC voltage signals VL and VH are input, respectively. The inverting/non-inverting input terminals (VINM) and (VINP) are connected to the base terminals of transistors Q10 and Q11, respectively, of which the emitter terminals are arranged to be in common connection. The corrector terminals of the transistors Q10 and Q11 are connected to a supply potential VCC via resistance elements R10 and R11, respectively, while the emitter terminals are connected to a ground potential via an AC power supply B1. The corrector terminal of the transistor Q10 is connected to the corrective element 14, and a potential at the corrector terminal of the transistor Q10 is output as the adjusting signal VCNT.

The corrective element 14 has variable capacitance elements C5 and C6, which are NMOS (n-channel metal-oxide semiconductors) transistors whose source terminals and drain terminals are short-circuited and connected to the corrector terminal of the transistor Q10 (varactor structure). The gates of the variable capacitance elements C5 and C6 are connected in parallel to the gates of variable capacitance elements C3 and C4 in the VCO circuit 11, respectively. The capacitance value of the VCO circuit 11s, therefore, the total of the combined capacity value of the variable capacitance elements C3 and C5 and that of the variable capacitance elements C4 and C6.

The VCO circuit 11 includes a resonance circuit composed of the inductor section 20, the capacitance section 21, and the corrective element 14. The oscillation frequency fVCO of this resonance circuit is given by the equation (1), where the frequency fVCO is determined by the inductance L of the inductor section 20 and by the combined capacity C of the capacitance section 21 and the corrective element 14. The oscillation frequency control signal VT changes the capacity of variable-capacitance diodes in the capacitance section 21 to control the oscillation frequency fVCO. Meanwhile, the adjusting signal VCNT changes the capacity of variable-capacitance diodes in the corrective element 14 to adjust the oscillation frequency fVCO in response to element dispersion.

Figure 8:
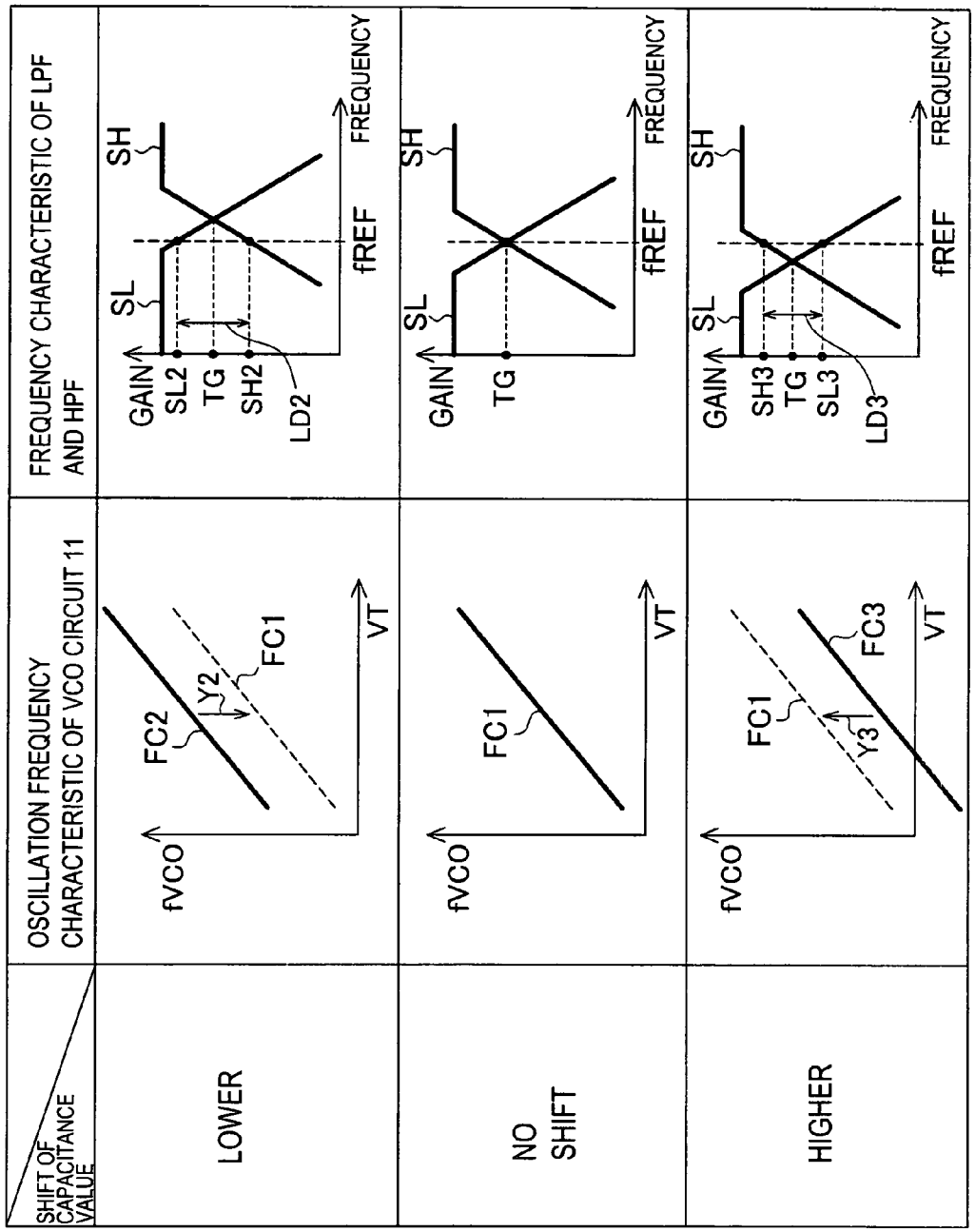
FIG. 8 is a chart for explaining the performance of the VCO circuit 11.
Figure 9:
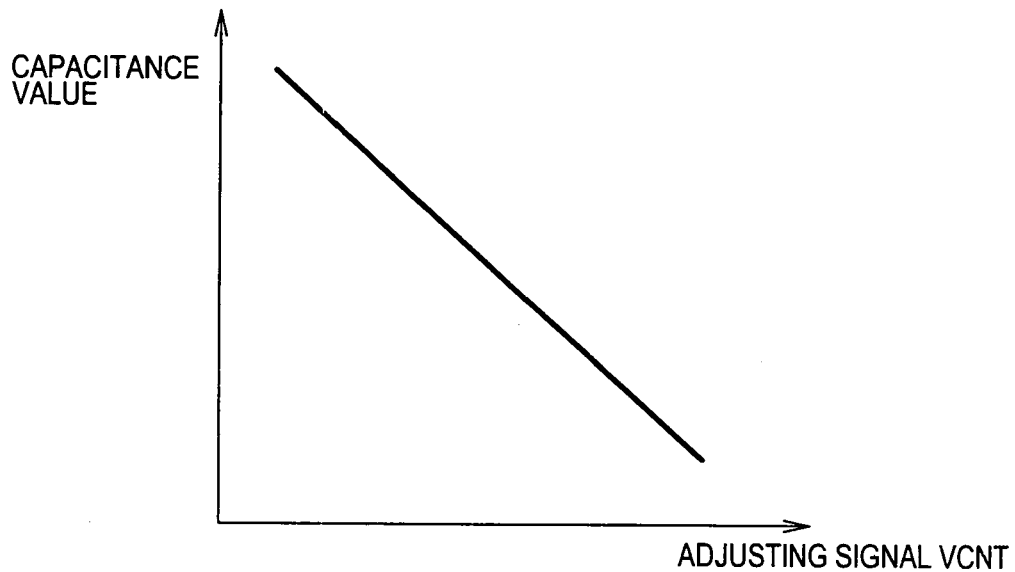
FIG. 9 is a chart for depicting the capacitance characteristic of the variable capacitance element relative to the adjusting signal VCNT.

FIG. 8 is the chart for explaining the performance of the VCO circuit 11. When the VCO circuit 11 is in an ideal state, where no elements in the VCO circuit have manufacture-related dispersion, thus cause no fluctuation of capacitance values (as shown in the middle rank of the chart), the low-pass/high-pass filter 15 and 16 give an identical gain (target gain TG) in response to the input reference frequency fREF, according to the initial setup of the filters 15 and 16. Therefore, when no elements have manufacture-related dispersion, respective output gains of the low-pass filter 15 and the high-pass filter 16 in response to the input reference frequency fREF are coincide with the target gain TG. As a result, the frequency-gain characteristic lines of the low-pass filter 15 and the high-pass filter 16, the lines having gradients reverse to each other, cross at the target gain TG (as shown in the middle rank of the chart). The cross point indicates that the output signals SL and SH from both filters 15 and 16 show no output level difference, so that the DC voltage signals VL and VH, which are the result of DC conversion of the output signals SL and SH at the DC conversion circuits 17 and 18, also show no level difference. Hence the DC voltage signals VL and VH at the same level are input in the comparator circuit 19.

The comparator circuit 19 works as follows. In FIG. 7, current I flows through the AC power supply B1. When the DC voltage signals VL and VH at the same level are input in the comparator circuit 19, input current flows through resistance elements R10 and R11 as respective split current that is I/2 as large as the original current. This provides the adjusting signal VCNT1 in the case of no element dispersion, which is defined by the following equation (4):

$$VCNT1 = VCC - Rx(I/2)$$

When this adjusting signal VCNT1 is input in the corrective element 14, the capacitance value of the variable capacitance elements C5 and C6 is adjusted in accordance with the adjusting signal VCNT1. Since the oscillation frequency of the VCO circuit 11 is determined by the resonance circuit in which the capacitance value of the capacitance section 21 and of the corrective element 14 are added up, determining the capacitance value of the variable capacitance elements C5 and C6 means determining an oscillation frequency characteristic FC1 of the VCO circuit 11 (as shown in the middle rank of the chart). This oscillation frequency characteristic FC1 represents the oscillation frequency characteristic of the VCO circuit 11 that is in the ideal state where no element dispersion exists, thereby representing the oscillation frequency characteristic that is the reference for frequency characteristic correction.

On the contrary to the above case, the capacitance value of the variable capacitance elements C3 and C4 in the capacitance section 21 may change to drop in the VCO circuit 11 due to manufacture-related dispersion (as shown in the upper rank of the chart). When the capacitance value of the variable capacitance elements C3 and C4 drop due to manufacture-related dispersion and the same voltage as the oscillation frequency control signal VT is applied to the corrective element 14 without any capacitance value correction by the adjusting signal VCNT, respective capacitance values of C1 and C2, C5 and C6 also drop at the same rate as the variable capacitance elements C3 and C4. In this case, since the oscillation frequency of the VCO circuit 11 is determined by the resonance circuit in which the capacitance value of the capacitance section 21 and of the corrective element 14 are added up, the oscillation frequency characteristic of the VCO circuit 11 shifts to the high-frequency side, which is a result given by the equation (1), to become an oscillation frequency characteristic FC2 (as shown in the upper rank of the chart).

Also, when the capacitance values C1 and C2 of the variable capacitance elements C1 and C2 drop, the cut-off frequency fCUTL of the low-pass filter 15 and the cut-off frequency fCUTH of the high-pass filter 16 shift to the high-frequency side, which is a result given by the equations (2) and (3). At this time, the capacitance values C1 and C2 change as they retain the prescribed correlation, thus the cut-off frequencies fCUTL and fCUTH also change as they retain the prescribed correlation. As a result, the frequency-gain characteristic of the filters 15 and 16 shifts in parallel to the high-frequency side as the intersection of frequency-gain characteristic lines at the target gain TG is maintained, as shown in the upper rank of the chart of FIG. 8.

At this time, the frequency-gain characteristic shown in the upper rank of the chart demonstrate that the level of an output signal SL2 from the low-pass filter 15 in response to the reference frequency fREF becomes higher than the target gain TG, while the level of an output signal SH2 from the high-pass filter 16 at the reference frequency fREF becomes lower than the target gain TG. This means that the signal SL2 becomes higher than the output signal SH2 in output level in response to the reference frequency fREF, which results in an output level difference LD2.

The output signals SL2 and SH2 are sent to the DC conversion circuits 17 and 18 and are converted into the DC voltage signals VL and VH, where the level of the signal VL also becomes higher than that of the signal VH. When the DC voltage signals VL and VH are input in the comparator circuit 19, the higher voltage level of the signal VL makes the current flowing through the resistance element R10 larger than that flowing through the resistance element R11. When a current increase/decrease caused by element dispersion is taken here to be a current variation α, the current flow in the resistance R10 is defined as I/2+α while that in the resistance R11 as I/2−α. Thus, an adjusting signal VCNT2 for the case of the lower dispersion of the capacitance values is given by the following equation (5):

$$VCNT2 = VCC - Rx(I/2 + \alpha)$$

As indicated by the equation (5), the adjusting signal VCNT1 resulting in the case of lower dispersion of the capacitance values becomes lower in voltage level than the adjusting signal VCNT1 (equation (4)) in the case of no capacitance value dispersion.

Figure 10:
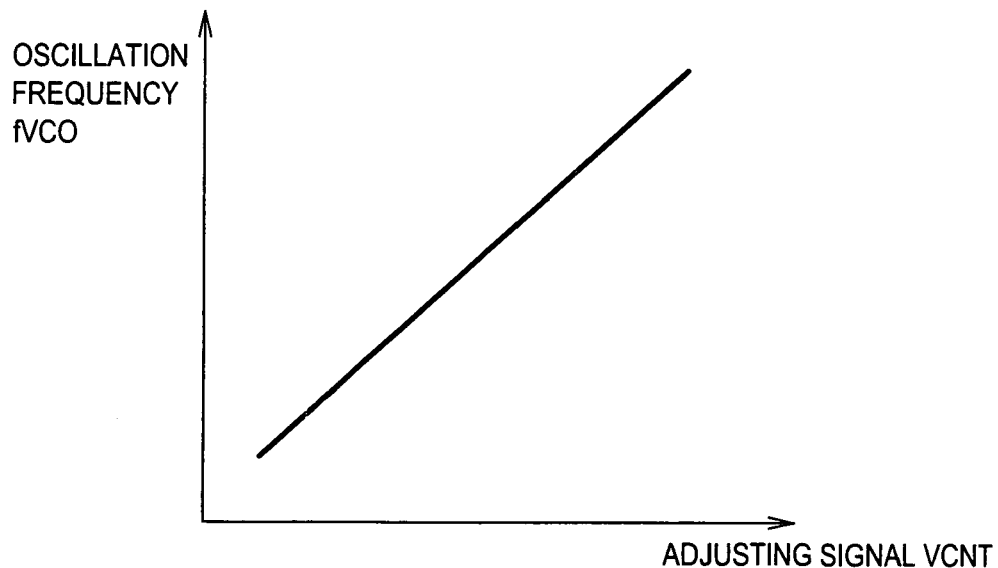
FIG. 10 is a chart for depicting a correlation between the adjusting signal VCNT and the oscillation frequency fVCO.

The adjusting signal VCNT2 is applied to the variable capacitance elements C5 and C6 of the corrective element 14. The capacitance value of the variable capacitance elements C5 and C6 have a control voltage characteristic shown in FIG. 9, according to which the capacitance value decreases as the voltage level of the adjusting signal VCNT increases. The capacitance value of the variable capacitance elements C5 and C6, therefore, increases to the same extent as the level of the adjusting signal drops from VCNT1 to VCNT2, according to the above control voltage characteristic. The increment of the capacitance value of the variable capacitance elements C5 and C6 enlarges the combined capacity value C of the VCO circuit 11, thus the oscillation frequency fVCO shifts to the low-frequency side as indicated by the equation (1). Hence the adjusting signal VCNT and the oscillation frequency fVCO have a correlation as shown in FIG. 10, according to which the oscillation frequency fVCO drops as the voltage level of the adjusting signal VCNT decreases.

The oscillation frequency characteristic is, therefore, adjusted by the adjusting signal VCNT in correspondence to an output level difference at the filters 15 and 16. With a proper setting, the oscillation frequency characteristic is made to become the oscillation frequency characteristic FC1, which is given when no element dispersion exists in the VCO circuit 11, after the adjustment by the signal VCNT, that is, the oscillation frequency characteristic can be corrected from FC2 to FC1 as indicated by the arrow Y2 in the upper rank of the chart of FIG. 8.

There is another case where the capacitance value of the variable capacitance elements C3 and C4 in the capacitance section 21 changes to increase in the VCO circuit 11 due to manufacture-related dispersion (as shown in the lower rank of the chart). When the capacitance value of the variable capacitance elements C3 and C4 increases due to manufacture-related dispersion and the same voltage as the oscillation frequency control signal VT is applied to the corrective element 14 without any correction by the adjusting signal VCNT, respective capacitance values of the variable capacitance elements C1 and C2, C5 and C6 also increase at the same rate as the variable capacitance elements C3 and C4. In this case, since the oscillation frequency of the VCO circuit 11 is determined by the resonance circuit in which the capacitance value of the capacitance section 21 and of the corrective element 14 are added up, the oscillation frequency characteristic of the VCO circuit 11 shifts to the low-frequency side, which is a result given by the equation (1), to become an oscillation frequency characteristic FC3 (as shown in the lower rank of the chart). At the same time, the cut-off frequency fCUTL of the low-pass filter 15 and the cut-off frequency fCUTH of the high-pass filter 16 shift to the low-frequency side, which is a result given by the equations (2) and (3). As a result, the level of an output signal SL3 from the low-pass filter 15 in response to the reference frequency fREF becomes lower than the target gain TG, while the level of an output signal SH3 from the high-pass filter 16 in response to the reference frequency fREF becomes higher than the target gain TG. This means that the signal SL3 becomes lower than the signal SH3 in output level in response to the reference frequency fREF, which results in an output level difference LD3.

The output signals SL3 and SH3 are sent to the DC conversion circuits 17 and 18 and are converted into the DC voltage signals VL and VH, where the level of the signal VL also becomes lower than that of the signal VH. When the DC voltage signals VL and VH are input in the comparator circuit 19, the lower voltage level of the signal VL makes the current flowing through the resistance element R10 smaller than that flowing through the resistance element R11. When a current increase/decrease caused by element dispersion is taken to be a current variation $\alpha$, the current flow in the resistance R10 is defined as $I/2-\alpha$ while that in the resistance R11 as $I/2+\alpha$. Thus, an adjusting signal VCNT3 for the case of the higher dispersion of the capacitance values is given by the following equation (6):

$$VCNT3 = VCC - Rx(I/2-\alpha)$$

As indicated by the equation (6), the adjusting signal VCNT3 resulting in the case of higher dispersion of the capacitance values becomes higher in voltage level than the adjusting signal VCNT1 (equation (4)) in the case of no capacitance value dispersion.

The adjusting signal VCNT3 is applied to the variable capacitance elements C5 and C6 of the corrective element 14. The capacitance value of the variable capacitance elements C5 and C6 have a control voltage characteristic shown in FIG. 9, according to which the capacitance value decreases as the voltage level of the adjusting signal VCNT increases. The capacitance value of the variable capacitance elements C5 and C6, therefore, decreases to the same extent as the level of the adjusting signal increases from VCNT1 to VCNT3. The reduction of the capacitance value of the variable capacitance elements CS and C6 reduces the combined capacity value C of the VCO circuit 11, thus the oscillation frequency fVCO shifts to the high-frequency side as indicated by the equation (1). Hence the adjusting signal VCNT and the oscillation frequency fVCO have a correlation as shown in FIG. 10, according to which the oscillation frequency fVCO increases as the voltage level of the adjusting signal VCNT increases.

The oscillation frequency characteristic is, therefore, adjusted by the adjusting signal VCNT in correspondence to an output level difference. With a proper setting, the oscillation frequency characteristic is made to become the oscillation frequency characteristic FC1, which is given when no element dispersion, that is, the oscillation frequency characteristic can be corrected from FC3 to FC1 as indicated by an arrow Y3 in the lower rank of the chart of FIG. 8.

According to the VCO circuit of the invention, therefore, a shift of the oscillation frequency characteristic of the VCO circuit from a desired characteristic can be recognized by detecting a differential between an actual gain of each filter and the target gain at the reference frequency in the attenuation band according to the frequency-gain characteristic of the low-pass filter and/or the high-pass filter. Accordingly, the oscillation frequency of the VCO circuit is adjusted in correspondence to the differential. This makes it possible to adjust the oscillation characteristic of the VCO circuit in a semiconductor integrated circuit by itself, which eliminates a need for a corrective control signal in circuit integration, thus a VCO function can be realized on one chip. The one-chip VCO function meets a demand for a space-savings component mounted on a portable device or the like.

Additionally, the adjustment of oscillation frequency corresponding to a differential eliminates the need for an oscillation characteristic adjustment for the VCO circuit in a separately constructed circuit, such as a PLL circuit, which includes the VCO circuit, thus eliminating a concern for a larger and more complicated circuit configuration. This also contributes to a space-savings component mounting on a portable device or the like.

Also, the frequency-gain characteristic line of the low-pass/high-pass filters have gradients reverse to each other and cross in the attenuation band of both filters. Because of these mutually reverse gain characteristics, a relatively large gain differential is formed and detected even when respective cut-off frequencies of the low-pass/high-pass filters shift only slightly from the reference frequency. This makes the detection of element dispersion more effective, enabling more accurate adjustment of the oscillation frequency characteristic.

Now, while the present invention has been described with the above embodiment, this description does not limit the invention. Various modification of the embodiment are possible within the true scope of the invention. The semiconductor device 10, according to the above embodiment, has the VCO circuit 11 and the corrective circuit H, and is capable of adjusting the oscillation frequency by the device itself. The application of the semiconductor device 10, however, is not limited to single use. The semiconductor 10 may be used to construct a PLL circuit. In such a case, the reference signal of the PLL circuit can replace the signal having the reference frequency fREF that is input in the corrective circuit H, so that a separate circuit for generating the reference frequency fREF is not necessary.

A stable reference signal other than the reference signal of the PLL circuit may also replace the signal having the reference frequency fREF to be input in the corrective circuit H. In this case, the necessity of preparing a separate circuit for generating the reference frequency fREF is also eliminated to contribute to the simplification of a circuit configuration when the semiconductor device 10 is used for an application other than as an element in the PLL circuit.

While the filter 12 is composed of both low-pass filter 15 and high-pass filter 16 according to the above embodiment, it is not the only case. The filter 12 may be composed of either of the filters 15 and 16. When the filter 12 is composed of the low-pass filter 15 only, the output signal SL and the target gain TG are output from the filter 12. The output signal SL and the target gain TG are converted into the DC voltage signal VL and a DC voltage signal VTG via the DC conversion circuit, and are input in the comparator circuit 19, respectively. The comparator circuit 19 outputs the adjusting signal VCNT to enlarge the capacitance value of the corrective element 14 in correspondence to a signal level difference when the DC voltage level of the signal VL is higher than that of the signal VGT, while outputting the adjusting signal VCNT to reduce the capacitance value of the corrective element 14 in correspondence to a signal level difference when the DC voltage level of the signal VL is lower than that of the signal VGT.

On the other hand, when the filter 12 is composed of the high-pass filter 16 only, the output signal SH and the target gain TG are output from the filter 12. In this case, as previously described, the DC conversion circuit outputs the DC voltage signal VH and the DC voltage signal VTG, respectively. The comparator circuit 19 outputs the adjusting signal VCNT to enlarge the capacitance value of the corrective element 14 in correspondence to a signal level difference when the voltage level of the signal VTG is higher than that of the signal VH, while outputting the adjusting signal VCNT to reduce the capacitance value of the corrective element 14 in correspondence to a signal level difference when the DC voltage level of the signal VTG is lower than that of the signal VH.

According to the above arrangement, the filter 12 composed of either of the low-pass/high-pass filters 15 and 16 enables the oscillation frequency adjustment of the VCO circuit. This leads to the further miniaturization of the configuration of the VCO circuit.

In the embodiment, the gains given in response to the input of the signal having the reference frequency fREF are the set target gains TG, which are made to coincide at the low-pass/high-pass filters 15 and 16. Another setting, however, is possible in such a way that the cut-off frequencies fCUTH and fCUTL of the low-pass filter 15 and/or the high-pass filter 16 are matched to the reference frequency fREF, respectively. In this setting, when the cut-off frequency is equivalent to the frequency of a gain attenuating by 3 (dB) (at the shoulder of the attenuation band), respective frequency-gain characteristic lines of the low-pass/high-pass filters 15 and 16 cross each other at their shoulders. In this case, when the capacitance elements of the VCO circuit 11 show dispersion to cause the cut-off frequencies to shift to the high-frequency side, an output signal SL, which is not attenuated, is output from the low-pass filter 15, while an attenuated output signal SH is output from the high-pass filter 16, thus a signal difference results. On the other hand, when the cut-off frequencies shift to the low-frequency side, an output signal SH, which is not attenuated, is output from the high-pass filter 16, while an attenuated output signal SL is output from the low-pass filter 15, thus a signal difference also results. Accordingly, the oscillation frequency of the CVO circuit can be adjusted in correspondence to respective signal differences.

It is desirable that the target gain TG should be a gain attenuating by 50% according to the frequency-gain characteristic. In this case, the frequency-gain characteristic lines of the low-pass/high-pass filters 15 and 16 cross just at the midpoint in the attenuation band. At this midpoint, in a view from the reference frequency fREF, the same size of an attenuation band exists both at the high-frequency side and at the low-frequency side. This provides an equal measuring range. Hence the optimum measuring range is secured so that the shift of the cut-off frequencies fCUTH and fCUTL is detected more accurately.

As shown in FIG. 7, according to the embodiment, the oscillation frequency control signal VT is input in the variable capacitance elements C3 and C4, while the adjusting signal VCNT is input in the variable capacitance elements C5 and C6 that compose the corrective element 14, and the variable capacitance elements C3 and C4 are connected to the variable capacitance elements C5 and C6, respectively. FIG. 7 shows a configuration which includes a plurality of pairs of variable capacitance elements and a plurality of signals input in the variable capacitance elements, but other configurations are also applicable if a configuration enables the variable control of the capacitance value of the VCO circuit in correspondence to a differential between the target gain and an actual gain at the filter 12.

Figure 11:
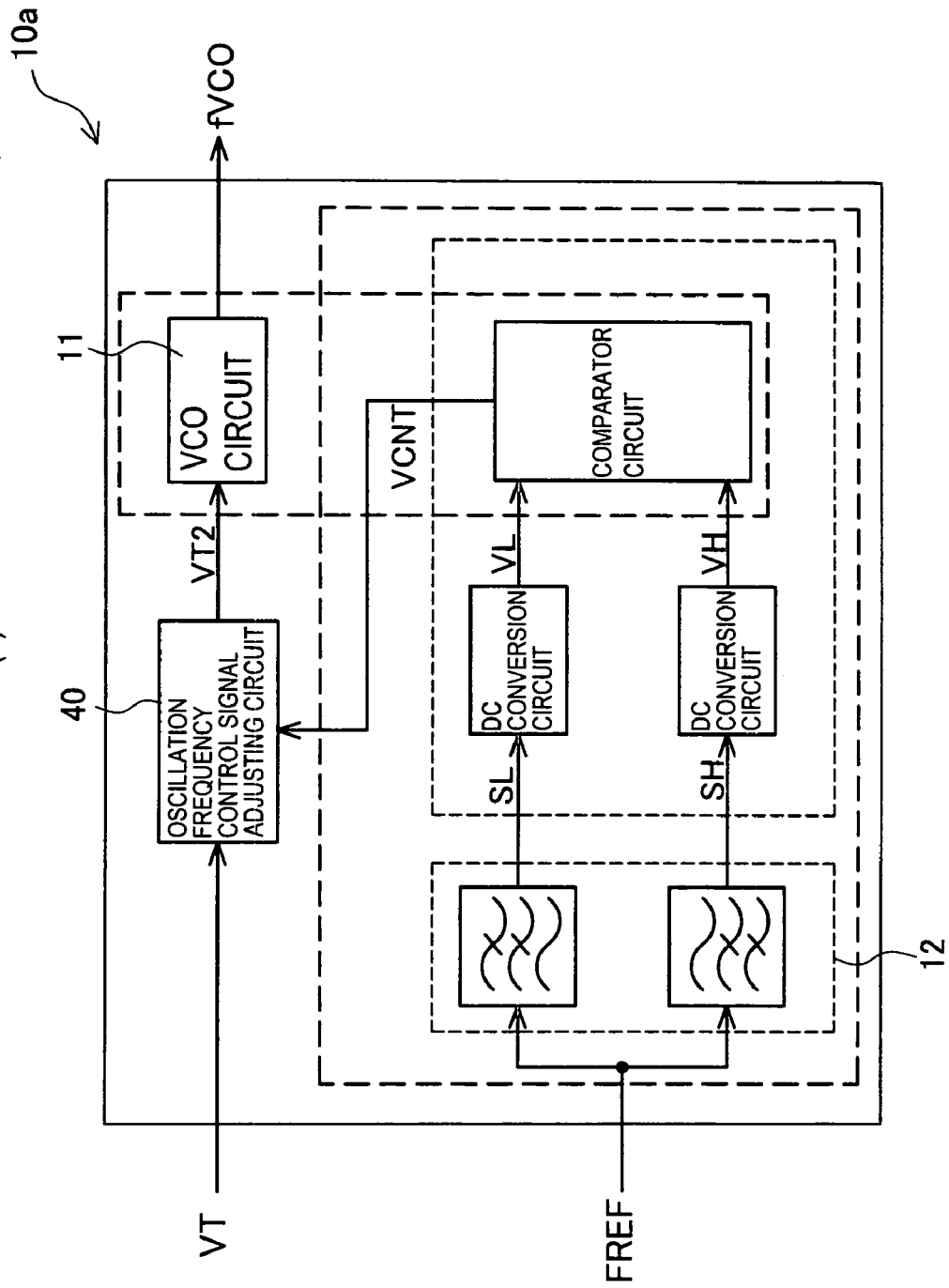
FIG. 11 is a circuit block diagram (2) for depicting the VCO circuit.
Figure 12:
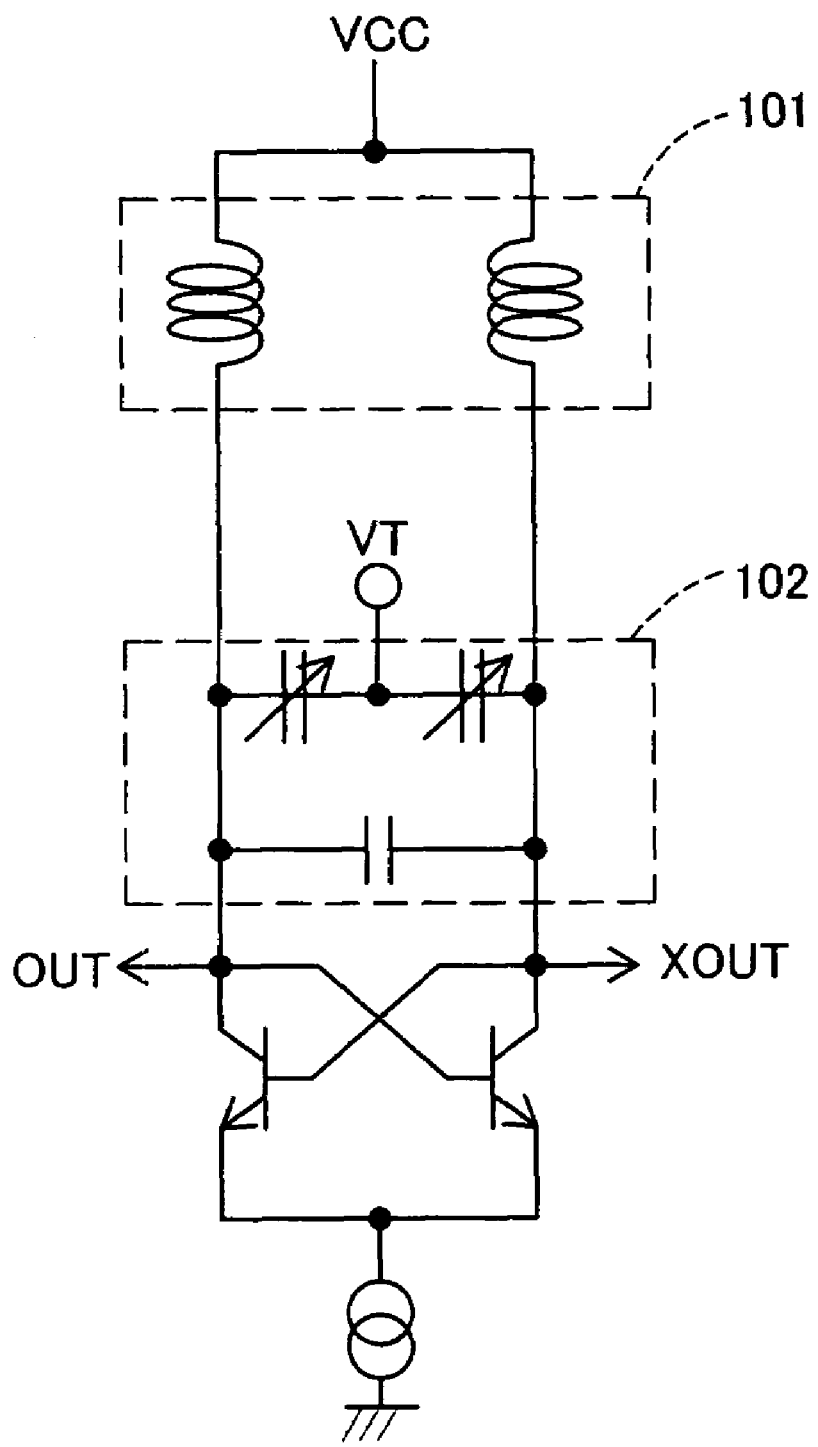
FIG. 12 is a circuit diagram of a conventional VCO circuit.
Figure 13:
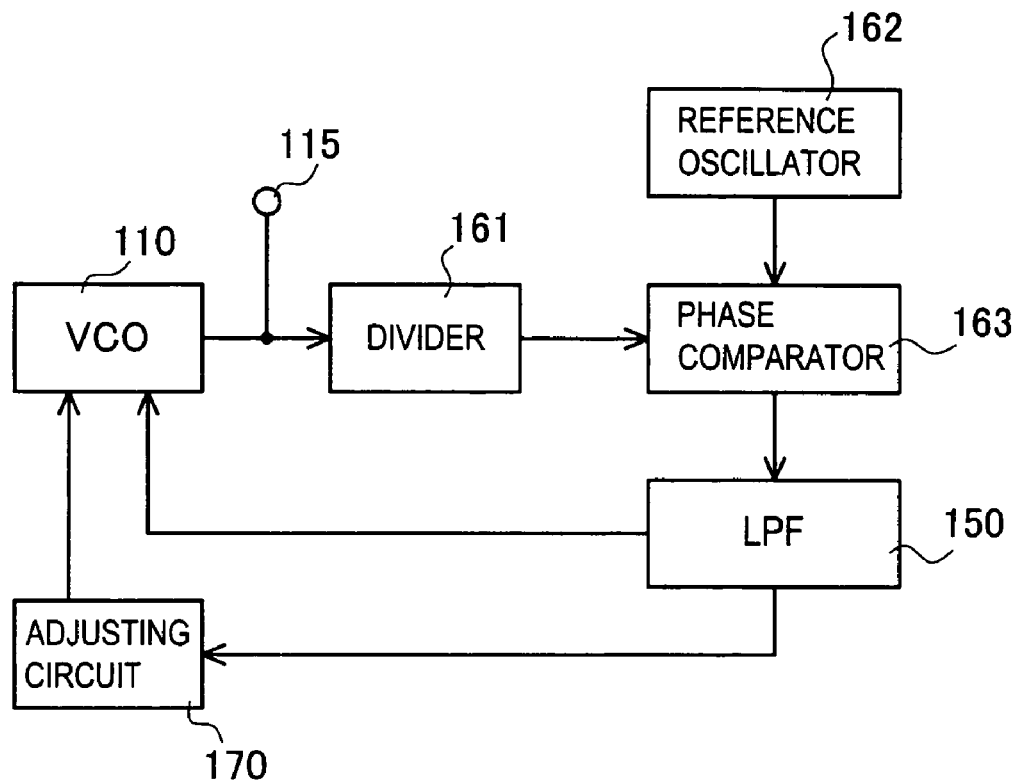
FIG. 13 is a block diagram of a conventional frequency synthesizer.
Figure 14:
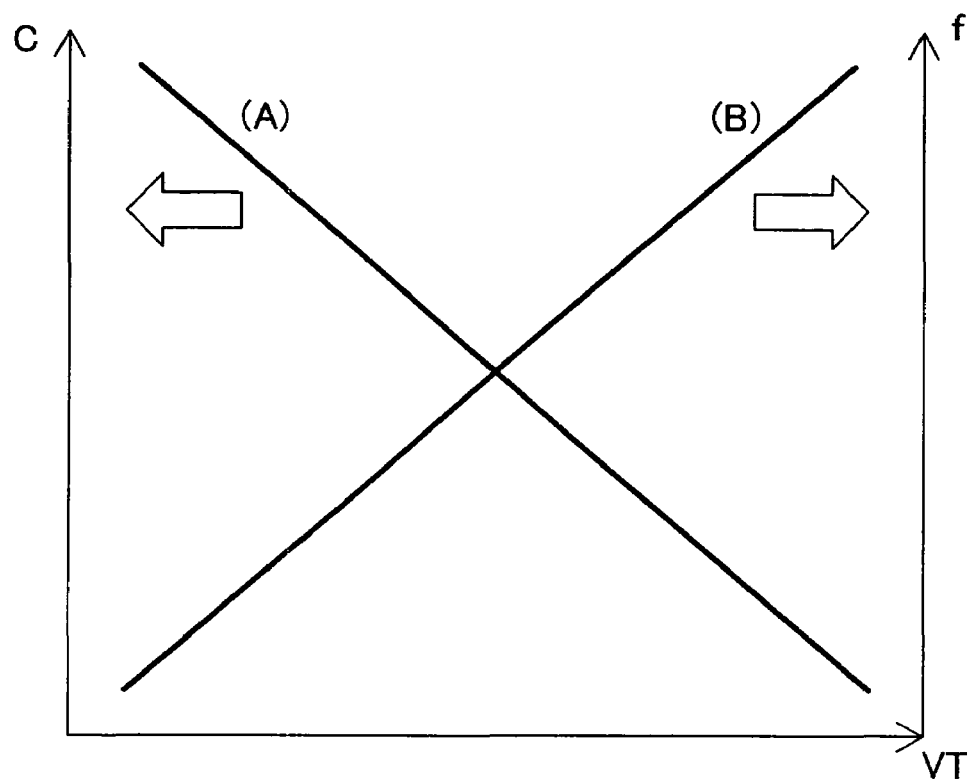
FIG. 14 is a chart for depicting a correlation between the characteristic value of the element and the oscillation frequency of the VCO circuit.

For example, a semiconductor device 10a shown in FIG. 11 may be used as a substitute for the semiconductor 10 shown in FIG. 2. The semiconductor device 10a has an oscillation frequency control signal adjusting circuit 40 instead of the corrective element 14. The oscillation frequency control signal VT and the adjusting signal VCNT are input in the oscillation frequency control signal adjusting circuit 40, where the oscillation frequency control signal VT is adjusted in accordance with the adjusting signal VCNT so that the oscillation frequency fVCO becomes one whereby the oscillation frequency characteristic is made when the VCO circuit is in the ideal state where no element dispersion exists. The oscillation frequency control signal adjusting circuit 40 outputs an adjusted oscillation frequency control signal VT2, which is input in the variable capacitance elements C3 and C4 (see FIG. 7) of the capacitance section 21 in the VCO circuit 11. Then the capacitance value of the variable capacitance elements C3 and C4 is adjusted in correspondence to a gain differential at the filter 12, thus the frequency characteristic of the VCO circuit 11 is adjusted. According to the above arrangement, therefore, the oscillation characteristic of the VCO circuit 11 can be adjusted to the ideal one without providing the corrective element 14. The oscillation frequency control signal adjusting circuit 40 may be substituted with a voltage adder which is used for an ordinary PLL circuit.

According to the embodiment, the low-pass filters (LPF) 15 and high-pass (HPF) 16 have coil elements L1 and L2, respectively, as shown in FIG. 3 and FIG. 4. The coil elements L1 and L2, however, may be replaced with respective resistance elements, after which the original capability of the filters is maintained.

Also, while FIG. 5 shows the half-wave rectifying circuit in the DC conversion circuits 17 and 18, using a full wave rectifying circuit 30 instead of the half-wave rectifying circuit 30 offers the same effect as the original DC conversion circuits 17 and 18.

The problems caused by manufacture-related dispersion, as described so far regarding the capacity of the capacitance elements, may occur to elements other than the capacitance elements. While the oscillation frequency control based on variable capacitance values is described in the embodiment, another method based on, for example, the control of mutual conductance is also equally effective.

The comparator circuit 19 is one form of a comparison section for comparison.

According to the invention, a self-adjustment of the oscillation characteristic by the VCO circuit only, which has the low-pass filter and/or the high-pass filter, becomes possible by adjusting the oscillation frequency of the VCO circuit in correspondence to a differential between the gain in response to the input reference frequency signal and the target gain at the reference frequency in the attenuation band according to the frequency-gain characteristic.

This eliminates a need for an oscillation characteristic adjustment in a separately constructed circuit including the VCO circuit, thus provides the VCO circuit and the adjusting method for the same, which enables an adjustment for suppressing the dispersion of the output characteristics of the VCO circuit in spite of the manufacture-related dispersion of element characteristics, using a simple circuit configuration.

What is claimed is:

1. A voltage control oscillation circuit comprising:
a low-pass filter and/or a high-pass filter, each of which is preset to have an actual gain which is intended to be identical to a preset target gain at a reference frequency in an attenuating band according to a frequency-gain characteristic in response to an input signal having the reference frequency; and
an element that has a same structure as an element that composes the low-pass filter and/or the high-pass filter and specifies an oscillation frequency;
wherein an element parameter of the element that specifies the oscillation frequency is adjusted in correspondence to a differential between the actual gain of the low-pass filter and that of the high-pass filter, or to a differential between either of respective gains of the low-pass/high-pass filters and the target gain at the reference frequency.

2. The voltage control oscillation circuit according to claim 1, wherein
the element specifying the oscillation frequency is a variable capacitance element having a capacitance value that is adjusted variably in correspondence to the differential.

3. The voltage control oscillation circuit according to claim 2, wherein
an oscillation frequency control signal for controlling the oscillation frequency of the voltage control oscillation circuit and
an adjusting signal for adjusting the capacitance value are input in the variable capacitance element.

4. The voltage control oscillation circuit according to claim 3, wherein the variable capacitance element has
a main element in which the oscillation frequency control signal is input, and
a corrective element which is connected in parallel to the main elements and in which the adjusting signal is input.

5. The voltage control oscillation circuit according to claim 1, the oscillation circuit comprising
the low-pass filter and the high-pass filter, which are preset so that respective target gains of both filters coincide.

6. The voltage control oscillation circuit according to claim 1, wherein
respective cut-off frequencies of the low-pass filter and/or the high-pass filter are set to coincide with the reference frequency.

7. The voltage control oscillation circuit according to claim 1, wherein the target gain is set to be equal to a gain attenuating by 50% according to the frequency-gain characteristic.

8. The voltage control oscillation circuit according to claim 3, the oscillation circuit comprising:
a DC conversion section that smoothes an output signal from the low-pass filter and/or from the high-pass filter; and
a comparison section that outputs the adjusting signal in correspondence to a signal level difference between the output signal from the low-pass filter and the output signal from the high-pass filter, or to a signal level difference between the output signal from the low-pass filter and the target gain, or to a signal level difference between the output signal from the high-pass filter and the target gain.

9. The voltage control oscillation circuit according to claim 8, wherein
the comparison section outputs the adjusting signal to enlarge the capacitance value of the variable capacitance element in correspondence to respective signal level differences when the level of the output signal from the low-pass filter is higher than the level of the output signal from the high-pass filter, or the level of the output signal from the low-pass filter is higher than the level of the target gain of the low-pass filter, or the level of the target gain of the high-pass filter is higher than the level of the output signal from the high-pass filter, while
the comparison section also outputs the adjusting signal to reduce the capacitance value of the variable capacitance element in correspondence to respective signal level differences when the level of the output signal from the low-pass filter is lower than the level of the output signal from the high-pass filter, or the level of the output signal from the low-pass filter is lower than the level of the target gain of the low-pass filter, or the level of the target gain of the high-pass filter is lower than the level of the output signal from the high-pass filter.

10. An adjusting method for a voltage control oscillation circuit, the adjusting method comprising:
obtaining a differential between an actual gain of a low-pass filter and that of a high-pass filter at a reference frequency, or a differential between either of respective actual gains of the low-pass or high-pass filters and a target gain at the reference frequency; and
adjusting an element parameter that has a same structure as an element that composes the low-pass filter and/or the high-pass filter and specifies an oscillation frequency in correspondence to the differential.

11. The adjusting method for the voltage control oscillation circuit according to claim 10, wherein:
the element parameter is a capacitance value,
the capacitance value of the element parameter is enlarged relative to a signal level difference between respective output signals and the target gain or to a signal level difference between respective output signals when a level of an output signal from the low-pass filter is higher than a level of an output signal from the high-pass filter, or the level of the output signal from the low-pass filter is higher than a level of a target gain of the low-pass filter, or a level of a target gain of the high-pass filter is higher than the level of the output signal from the high-pass filter,
while the capacitance value of the element parameter is reduced relative to respective signal level differences when the level of the output signal from the low-pass filter is lower than the level of the output signal from the high-pass filter, or the level of the output signal from the low-pass filter is lower than the level of the target gain of the low-pass filter, or the level of the target gain of the high-pass filter is lower than the level of the output signal from the high-pass filter.

* * * * *

UNITED STATES PATENT AND TRADEMARK OFFICE
CERTIFICATE OF CORRECTION

PATENT NO.         : 7,482,882 B2
APPLICATION NO.    : 11/143643
DATED              : January 27, 2009
INVENTOR(S)        : Yonekawa et al.

It is certified that error appears in the above-identified patent and that said Letters Patent is hereby corrected as shown below:

Title Page, line 73

--Fujitsu Limited, Kawasaki (JP)-- should read "Fujitsu Microelectronics Ltd., Tokyo, Japan"

Signed and Sealed this

Eighth Day of September, 2009

David J. Kappos
*Director of the United States Patent and Trademark Office*